United States Patent [19]
Faz et al.

[11] Patent Number: 5,669,316
[45] Date of Patent: Sep. 23, 1997

[54] TURNTABLE FOR ROTATING A WAFER CARRIER

[75] Inventors: Albert Faz; Rodolfo U. Coronado, both of San Antonio, Tex.

[73] Assignees: Sony Corporation, Tokyo, Japan; Sony Electronics Inc., Park Ridge, N.J.

[21] Appl. No.: 166,182

[22] Filed: Dec. 10, 1993

[51] Int. Cl.⁶ ............................................. A47B 11/00
[52] U.S. Cl. ................... 108/142; 108/22; 156/345; 156/625; 156/639; 134/33; 269/57; 269/71; 269/903
[58] Field of Search ........................ 156/345, 625, 156/639; 134/33; 269/57, 71, 903; 108/108, 137, 139, 142; 437/925; 29/25.01; 414/935, 936

[56] References Cited

U.S. PATENT DOCUMENTS

| | | | |
|---|---|---|---|
| 3,933,539 | 1/1976 | Gartman | 148/171 |
| 4,667,076 | 5/1987 | Amada | 29/25.01 |
| 4,778,382 | 10/1988 | Sakashita | 414/936 |
| 4,813,846 | 3/1989 | Helms | 414/935 |
| 4,868,490 | 9/1989 | Blumenthal | 29/25.01 |
| 4,871,417 | 10/1989 | Nishizawa et al. | 134/33 |
| 4,897,709 | 1/1990 | Yokoyama et al. | 357/68 |
| 4,941,491 | 7/1990 | Goerss et al. | 134/111 |
| 4,949,848 | 8/1990 | Kos | 211/41 |
| 4,973,217 | 11/1990 | Engelbrecht | 414/936 |
| 5,001,084 | 3/1991 | Kawai et al. | 134/33 |
| 5,046,909 | 9/1991 | Murdoch | 414/935 |
| 5,178,638 | 1/1993 | Kaneko et al. | 29/25.01 |
| 5,197,500 | 3/1993 | Diamond | 134/142 |
| 5,223,001 | 6/1993 | Saeki | 29/25.01 |
| 5,248,380 | 9/1993 | Tanaka | 134/33 |
| 5,266,119 | 11/1993 | Taniguchi et al. | 29/25.01 |
| 5,270,482 | 12/1993 | Kos | 118/500 |
| 5,279,704 | 1/1994 | Saito | 134/33 |
| 5,310,410 | 5/1994 | Begin et al. | 29/25.01 |
| 5,314,574 | 5/1994 | Takahashi | 156/345 |
| 5,374,147 | 12/1994 | Hiroki et al. | 414/936 |
| 5,399,531 | 3/1995 | Wu | 437/925 |

FOREIGN PATENT DOCUMENTS

| | | | |
|---|---|---|---|
| 0103620 | 6/1985 | Japan | 156/345 MM |
| 0005523 | 9/1990 | Japan | 156/345 MM |
| 5251394 | 9/1993 | Japan | 156/345 |

*Primary Examiner*—John Niebling
*Assistant Examiner*—Long Pham
*Attorney, Agent, or Firm*—Pasquale Musacchio; Jerry A. Miller

[57] ABSTRACT

A turntable for rotating a wafer carrier in order to enable the attachment of a handle to the wafer carrier. The turntable includes a platform rotatably mounted to a baseplate. In addition, the turntable includes stops which are positioned to enable 180° clockwise and counterclockwise rotation of the platform to provide access to the wafer carrier for handle attachment. The platform includes carrier guides which are spaced apart to accommodate the wafer carrier. The platform further includes a platform handle which an operator manipulates to rotate the platform.

11 Claims, 6 Drawing Sheets

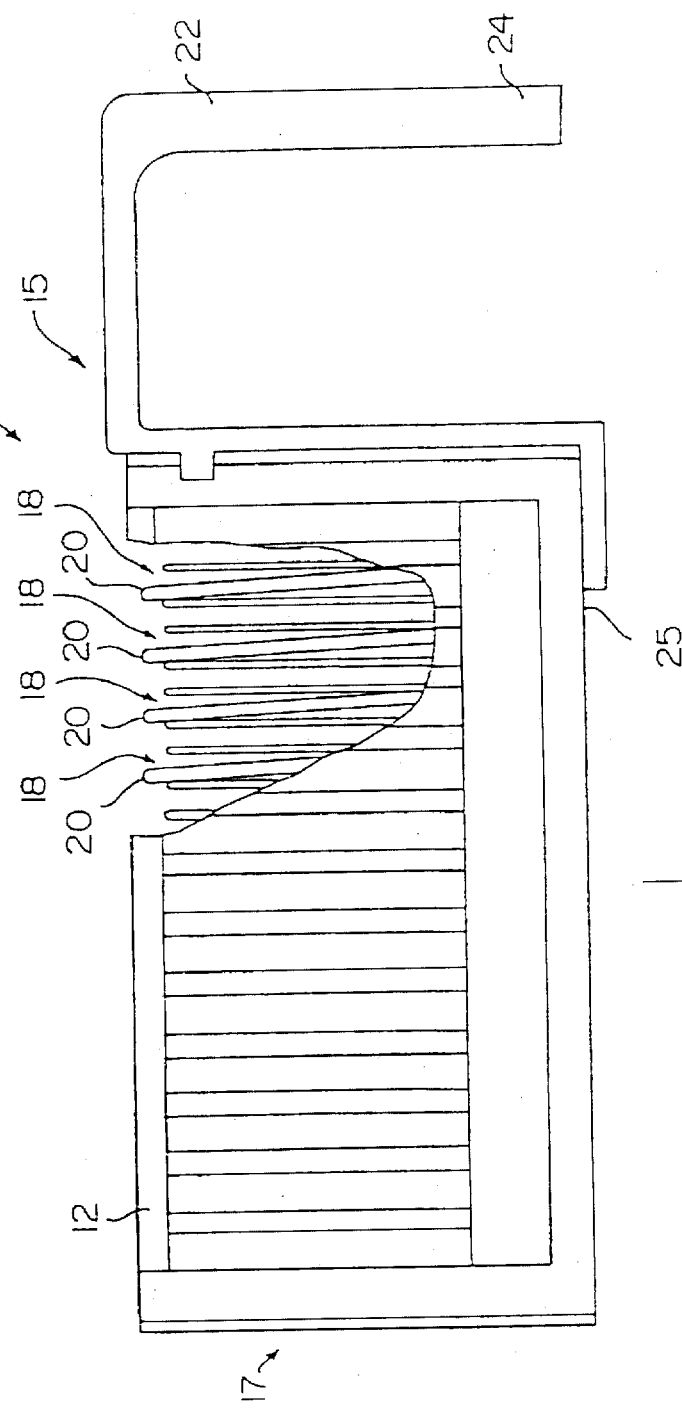
FIG. 1
PRIOR ART
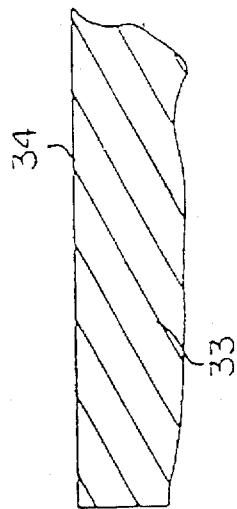
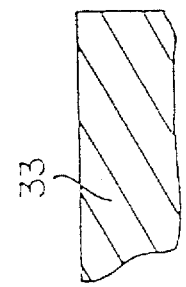

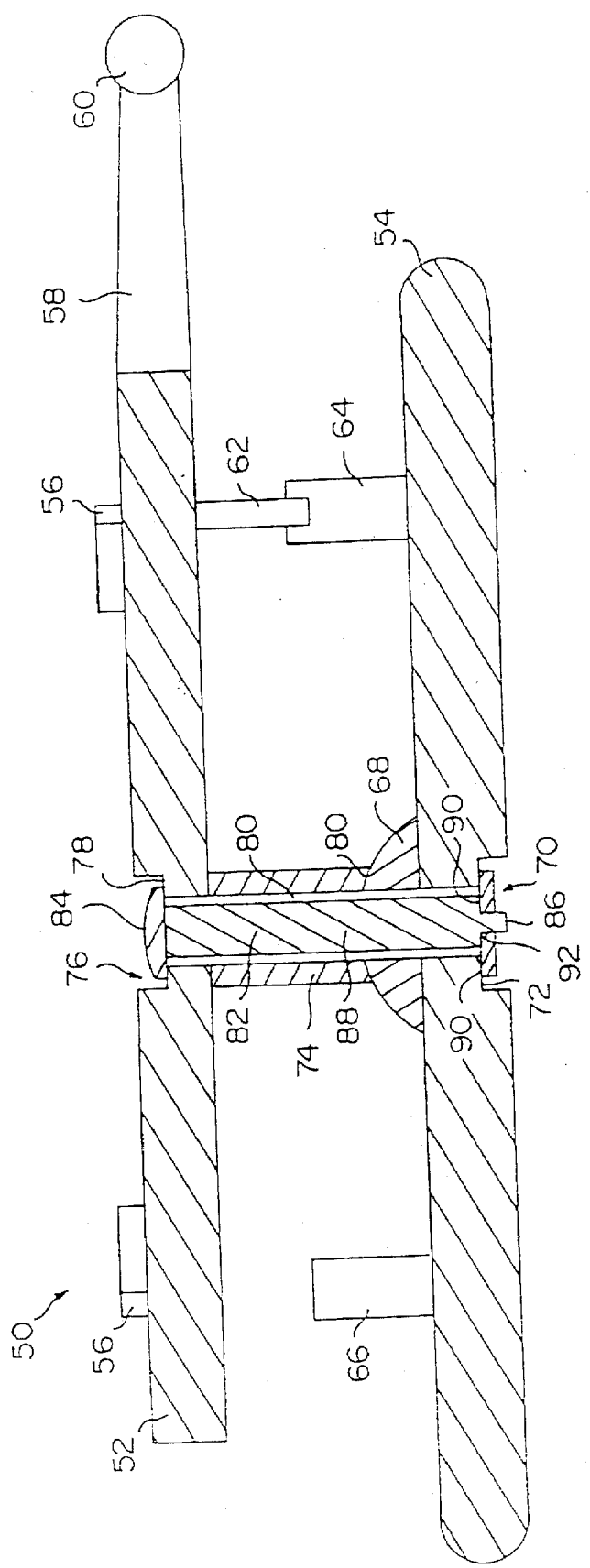

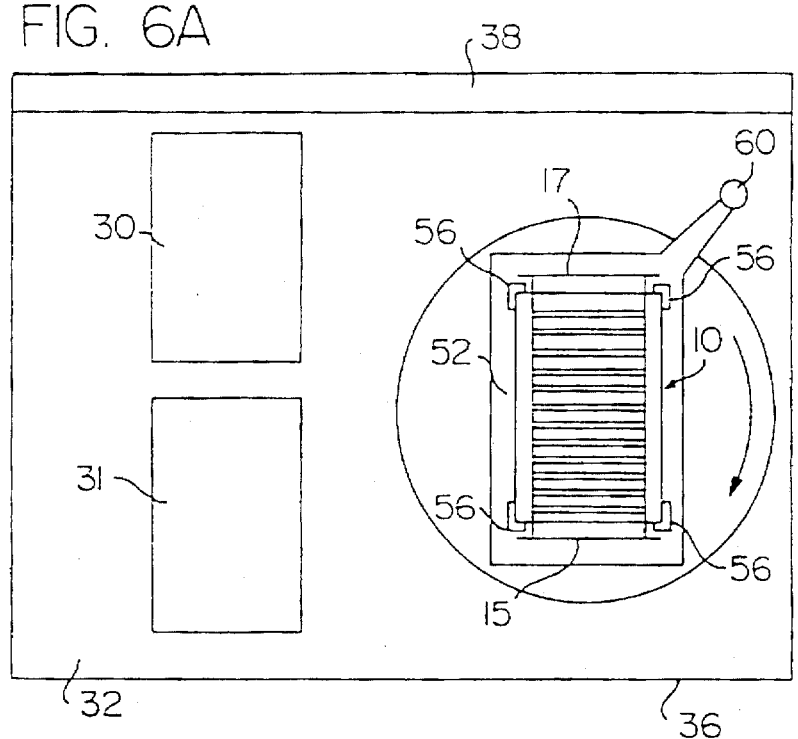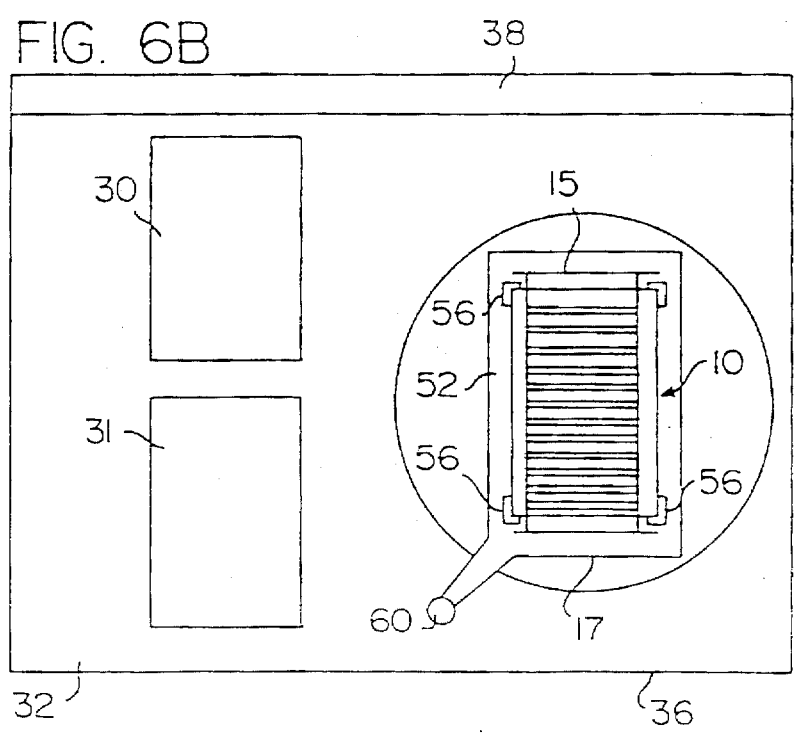

TURNTABLE FOR ROTATING A WAFER CARRIER

FIELD OF THE INVENTION

This invention relates to the manufacture of integrated circuits and more particularly, to a turntable which enables a wafer carrier to be rotated in order to enable the attachment of a handle to the wafer carrier.

BACKGROUND OF THE INVENTION

A silicon wafer is typically used to manufacture integrated circuits (ICs). Generally, a wafer is formed by growing silicon which is then sliced into thin wafers. The wafers are then lapped to a desired thickness, polished and chemically etched to provide a relatively smooth and defect free surface. Typically, a prepared wafer may be up to 5 inches in diameter and approximately 0.25 mm thick.

In order to enhance manufacturing efficiency, wafers are frequently processed in sets in many manufacturing operations. In one such manufacturing operation, a set of wafers is cleaned and etched simultaneously by placing the wafers in a "wet" station. The wafers are typically transported in a wafer carrier adapted to be inserted into an aperture of the wet station wherein cleaning and etching is performed. There are many types of commercially available wafer carriers. By way of example, one type of wafer carrier is manufactured by FLUOROWARE in Chaska, Minn. and is designated as model no. A193-55M-0515. Referring to FIG. 1, a typical wafer carrier 10 is shown positioned above a work surface 34 and a first aperture 30 formed in a wet station top section 33 shown as a partial cross-sectional view. The carrier 10 includes a housing 12 shown as a partial cut away view having a first end 15 and an opposite second end 17. The housing 12 further includes a plurality of walls grouped in pairs to form channels 18. Each of the channels 18 serve to hold a wafer 20. The walls are sufficiently spaced apart such that there is clearance room between each wafer 20 and the walls. As such, each wafer is oriented in a leaning position against a top portion of a wall of each of the channels 18. Insertion of the carrier 10 into the first aperture 30 enables cleaning and etching of each wafer 20 as previously described.

The carrier 10 further includes a first handle 22 removably secured to the first end 15. The first handle 22 includes a first grip 24 which extends vertically downward toward the work surface 34 along a substantial portion of the housing 12 and terminates before a bottom end 25 of the housing 12. As such, an operator is able to grasp the first grip 24 of the first handle 22 to transport the carrier 10 to a position above the first aperture 30. The first aperture 30 of the wet station 32 is sized to only accommodate the carrier 10 without the first handle 22. Therefore, lowering the carrier 10 results in contact between the first grip 24 and the work surface 34, thus inhibiting the insertion of the entire carrier 10 into the first aperture 30.

In order to be able to place the entire carrier 10 into the first aperture 30, the first handle 22 is removed from the first end 15 and a second handle having an elongated section is attached to the second end 17 of the carrier 10 as will be described. However, due to space constraints on the work surface 34, the carrier 10 must be turned around approximately 180° on the work surface 34 in order to access the second end 17. Referring to FIG. 2 in conjunction with FIG. 1, a top view of a wet station 32 having the first aperture 30 and a second aperture 31 is shown. The carrier 10 is positioned on the work surface 34 which includes a front edge 36 and a back wall 38. It is noted that the configuration of the wet station 32 is exemplary and may include more apertures. In FIG. 2, the carrier 10 is shown with the first handle 22 removed from the first end 15 and oriented such that the first end 15 faces the from edge 36 and the second end 17 faces the back wall 38. Placement of the carrier 10 into either the first 30 or second 31 aperture of the wet station 32 enables the cleaning and etching of each wafer 20 in the carrier 10. Typically, the work surface 34 is not of sufficient size to allow an elongated second handle to be attached to the second end 17 when the second end 17 faces the back wall 38. As such, the carrier 10 must be manually turned around approximately 180° by the operator as indicated by the arrow so that the second end 17 faces the front edge 36 and is thus accessible. Once the carrier 10 has been turned around, a second handle may be attached to the second end 17 of the carrier 10.

Referring to FIG. 3, a second handle 40 is shown secured to the second end 17 of the carrier 10. In FIG. 3, the carrier 10 is shown positioned over the first aperture 30 as previously described. The second handle 40 includes an elongated first fork portion 42 which extends through hollow first shoulder elements 44 located on a top section of the housing 12. A second elongated fork portion and shoulder elements are located on an opposite side of the housing 12 not shown in FIG. 3, which in conjunction with first fork portion 42 and first shoulder elements 44 serve to removably secure the second handle 40 to the housing 12. It is noted that other methods of removably securing the second handle 40 to the second end 17 may be employed for a typical wafer carrier. The second handle 40 includes a second grip 46 which extends horizontally outward from the second end 17. As such, the second grip 46 is substantially above the bottom end 25 of the housing 12, thus enabling the insertion of the housing 12 into either the first 30 or second 31 aperture for cleaning and etching.

Typically, many wafers are cleaned and etched during the course of each work shift. Consequently, several carriers are rotated on the work surface 34 during each work shift in order to attach the second handle 40 and enable insertion into either the first 30 or second 31 aperture. However, manually mining the carrier 10 on the work surface 34 has disadvantages. Wafers are typically manufactured in a cleanroom environment in order to reduce the possibility of contamination of the wafers. Frequently, while manually rotating the carrier 10 on the work surface 34, many irregular movements are made by the operator which are consequently transmitted to the carrier 10. These irregular movements result in the vibration or jarring of many of the wafers within their associated channels 18, thus creating particles that contaminate many of the wafers. Therefore, the operator must be careful not to jar or otherwise displace the wafers. As such, the mining operation is operator dependent and time consuming. Additionally, the operator typically wears protective gloves for protection against chemicals which are used to clean and etch the wafers. Generally, the protective gloves are cumbersome, which further inhibits an operator's ability to manipulate and rotate the carrier 10. Furthermore, the carrier 10 may hold a substantial quantity of wafers, resulting in a carrier weight of up to 7 pounds or more. Therefore, a further disadvantage is that repeated manual rotations of numerous carriers on the work surface 34 may possibly lead to the development of operator muscle strains or physical ailments such as carpal tunnel syndrome and others.

SUMMARY OF THE INVENTION

A turntable for rotating a wafer carrier in order to enable the attachment of a handle to the wafer carrier. The turntable includes a platform rotatably mounted to a baseplate. In addition, the turntable includes stops which are positioned to enable 180° clockwise and counterclockwise rotation of the platform to provide access to the wafer carrier for handle attachment. The platform includes carrier guides which are spaced apart to accommodate the wafer carrier. The platform further includes a platform handle which an operator manipulates to rotate the platform.

In an embodiment of the invention, a turntable for a wafer carrier is provided which includes a baseplate having first and second upwardly extending baseplate stop elements and a platform for supporting the wafer carrier. The platform includes a handle and a downwardly extending platform stop element which is adapted to engage either of the first and second baseplate stop elements. In addition, a mechanism is provided which enables rotation of the platform relative to the baseplate when the handle is grasped and manipulated by a user. Furthermore, the baseplate stop elements are positioned to stop the rotation by engaging the platform stop element in order to provide a predetermined angle of rotation.

BRIEF DESCRIPTION OF THE FIGURES

FIG. 1 is a view of wafer carrier having a first handle which inhibits the insertion of the carrier into an aperture of a wet station.

FIG. 5 is a cross sectional view of the turntable along section line 5—5 of FIG. 4.

FIGS. 6A–6B depict rotating the carrier on the turntable in order to attach the second handle.

DETAILED DESCRIPTION OF THE INVENTION

Figure 2:
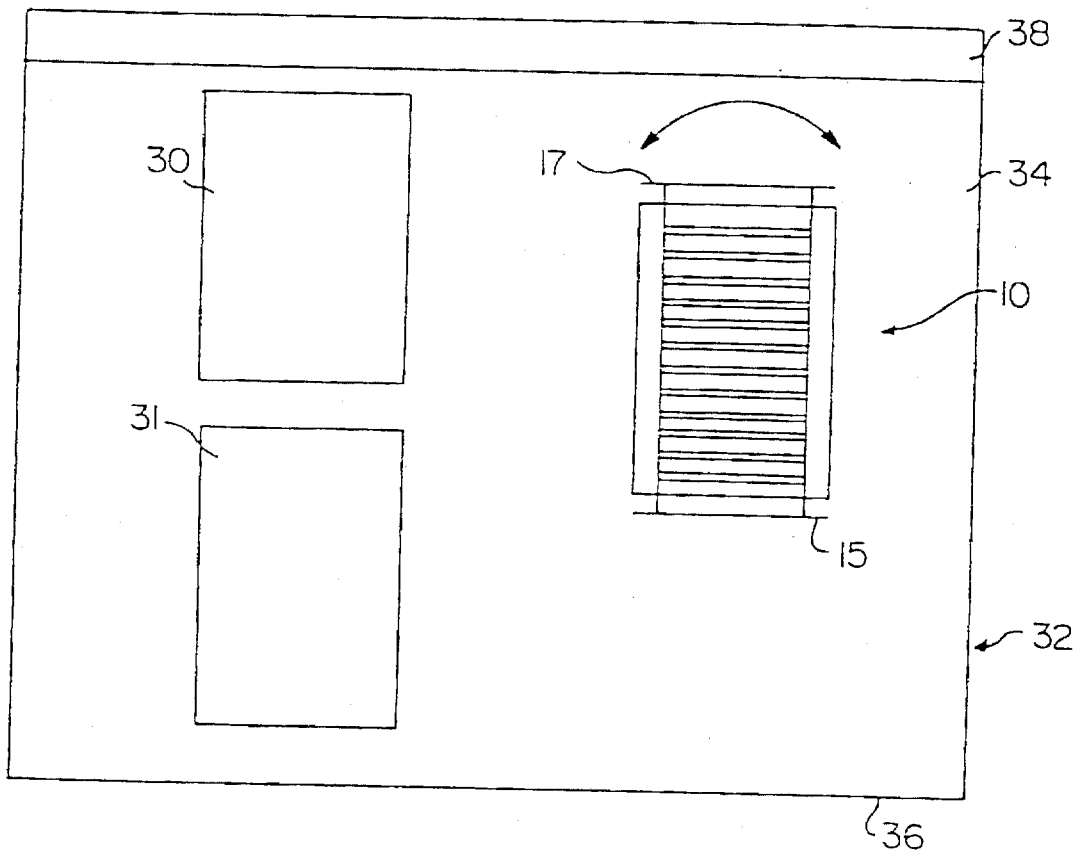
FIG. 2 is a top view of carrier positioned on a worksurface of the wet station and serves to illustrate a prior art method of mining the carrier on the worksurface in order to attach a second handle.

In order to enhance manufacturing efficiency, wafers are frequently processed in sets in many manufacturing operations. In one such manufacturing operation, a set of wafers is cleaned and etched simultaneously by placing the wafers in a "wet" station. The wafers are typically transported in a wafer carrier adapted to be inserted into an aperture of the wet station wherein cleaning and etching is performed. In order to be able to place the entire carrier into the aperture, the carrier must be mined around approximately 180° so that a handle may be affixed to the carrier which enables insertion of substantially the entire carrier into the aperture. The present invention for a turntable enables the rotation of the carrier and will now be described by referring to the following description in conjunction with FIGS. 4–6B wherein like elements are designated by like reference numerals.

Figure 4:
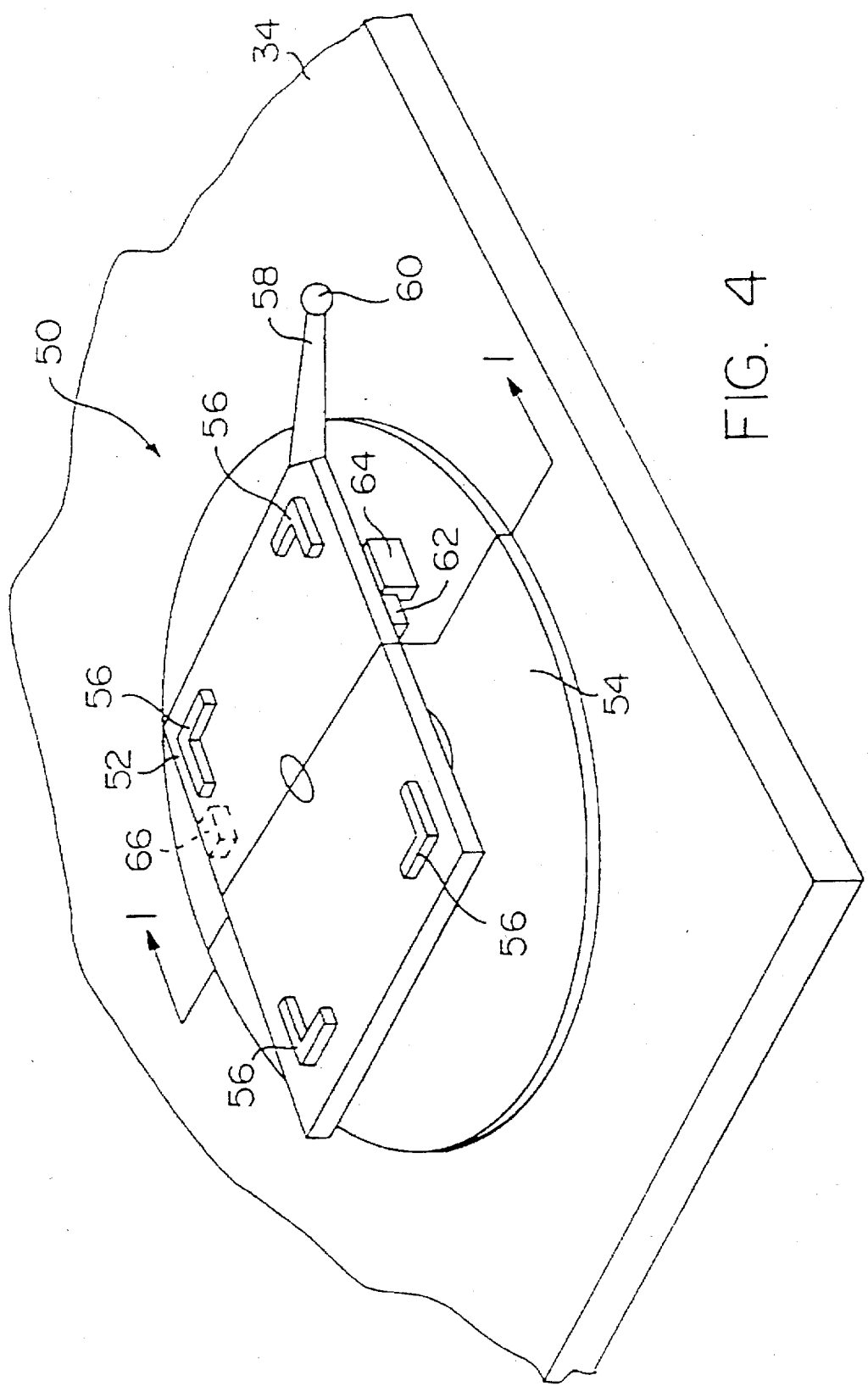
FIG. 4 is a view of a turntable in accordance with the present invention.

Referring to FIG. 4, a turntable apparatus 50 for a wafer carrier (not shown) is shown positioned on a work surface 34 such as that of a wet station. The turntable 50 includes a carrier platform 52 having a platform stop element 62 extending downwardly from the platform 52. The platform 52 is rotatably mounted to a baseplate 54 which rests on the work surface 34 as will be described. The baseplate 54 includes upwardly extending second 64 and third 66 (shown underneath platform element 52 in phantom lines) baseplate stop elements each of which are of sufficient size and positioned so as to engage the platform stop element 62 to stop rotation of the platform 52 after the platform 52 has been rotated approximately 180°. It is noted that the second 64 and third 66 baseplate stop elements or the platform stop element 62 may be positioned in order to provide other suitable angles of rotation. In the orientation shown in FIG. 4, the platform stop element 62 is shown against the second baseplate stop element 64. Consequently, the platform 52 may only be rotated clockwise 180° until the platform stop element 62 meets the third baseplate stop element 66, thus stopping rotation of the platform 52. Conversely, the platform 52 may then only be rotated counterclockwise 180° until the platform stop element 62 again contacts the second baseplate stop element 64.

In use, the carrier is positioned on the platform 52. The platform 52 includes substantially L-shaped carrier guides 56 integrally formed with the platform 52. The guides 56 are spaced apart to accommodate a substantially rectangularly shaped carrier such that each of the guides 56 is positioned at each corner of the carrier. The guides 56 serve to restrain movement of the carrier on the platform 52. It is noted that the guides 56 may also be constructed to be removably secured to the platform 52 so as to enable re-positioning of the guides 54 in order to accommodate other carrier sizes and shapes. The platform 52 further includes an outwardly extending platform handle 58. The platform handle 58 includes a ball shaped end 60 which may be gasped by an operator in order to rotate the platform 52.

Referring to FIG. 5, a cross sectional view of the turntable 50 is shown along section line 5—5 of FIG. 4. The baseplate 54 includes a first stationary member 68 having a semi-circular shape and a fastener bore 70 having a fastener surface 72. The platform 52 includes a downwardly extending rotating member 74 and a head bore 76 having a head surface 78. The rotating member 74 includes an arcuately shaped first end 80 adapted to slidably rotate on the first stationary member 68 to form a bearing surface. The stationary 68 and rotating 74 members may be fabricated from a relatively low friction material such as polytetrafluoroethylene sold under the trademark TEFLON in order to provide relatively smooth rotation of rotating member 74 on the stationary member 68. It is noted that TEFLON produces relatively few particles when constructed and used in this manner and is consequently acceptable for use in many cleanrooms. Additionally, the platform 52 and the baseplate 54 may be manufactured from stainless steel, polyvinyl chloride or other suitable materials.

The turntable 50 includes a passageway 81 which extends from the head surface 78 to the fastener surface 72. A fastener 82 having a head 84 and a threaded end 86 extends through the passageway 81 such that the head 84 is positioned on the head surface 78 and the threaded end 86 extends past the fastener surface 72. The fastener 82 includes a shank portion 88 which terminates in shoulders 90 before the threaded end 86. The shank portion 88 is sized such that the shoulders 90 correspond with the fastener surface 72. A fastening element 92 is threadably engaged with the threaded end 86 and abuts against the shoulders 90. Consequently, the platform 52 and rotating element 74 are rotatable relative to the stationary element 68, baseplate 54, fastener 82 and fastening element 92. It is noted that the turntable may be readily disassembled for cleaning by removing the fastening element 92 and fastener 82. In accordance with the present invention, the operator grasps the ball end 60 to rotate the platform 52 approximately 180° as previously described in order to rotate a carrier positioned on the platform 52 without jarring or vibrating the wafers held by the carrier.

Figure 3:
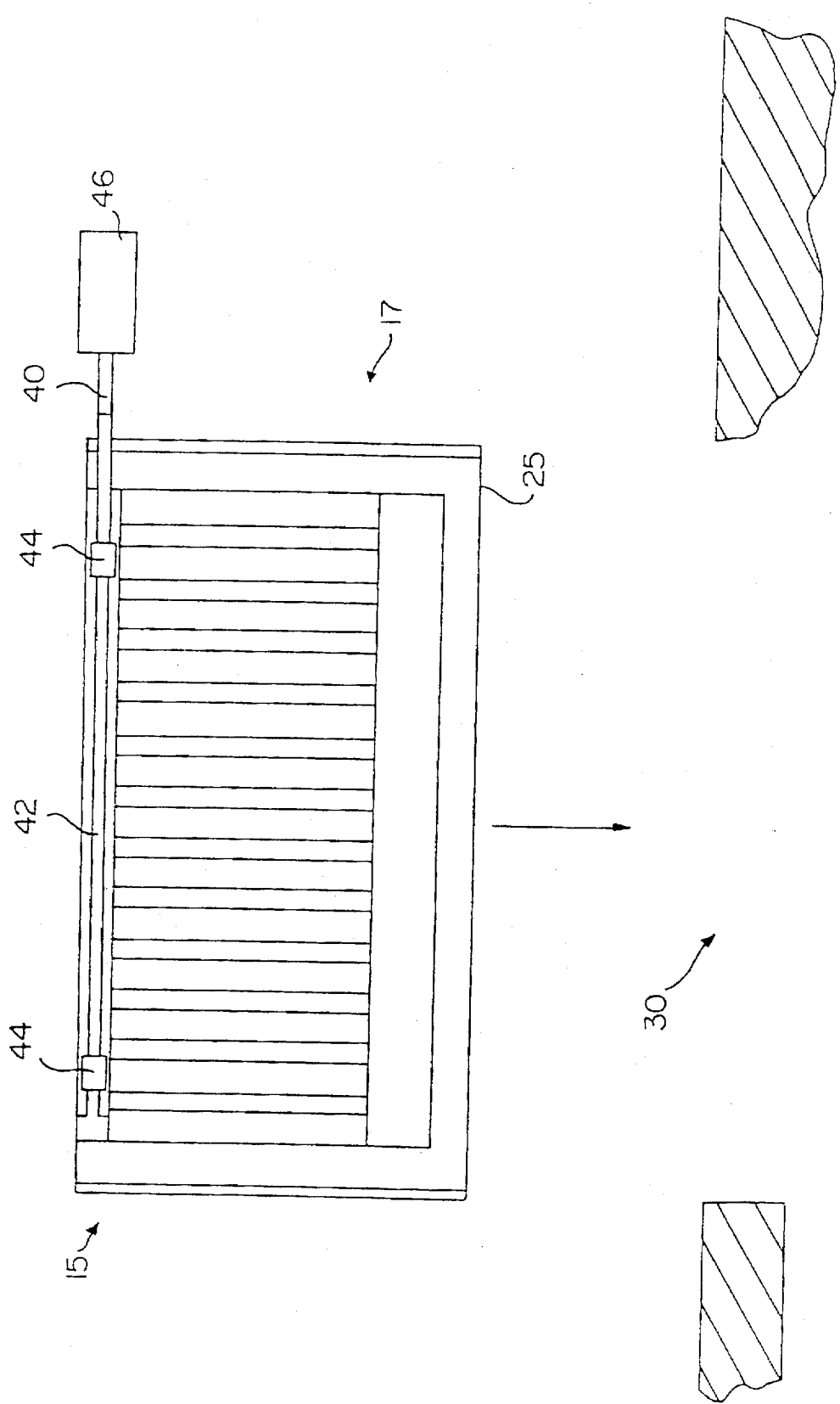
FIG. 3 is a view of the carrier having a second handle suitable for inserting the carrier into the aperture.

Referring to FIGS. 6A–6B, the turntable 50 is shown positioned on an exemplary wet station 32. As previously described, the carrier 10 is transported by the operator to the wet station 32 for placement into either the first 30 or second 31 aperture for cleaning and etching. In accordance with the present invention, the carrier 10 is positioned within the guides 56 such that the first end 15 faces the front edge 36 and the second end 17 faces the back wall 38 in a first position as shown in FIG. 6A. The first handle 22 (FIG. 1) is then removed from the first end 15. The operator then grasps the ball end 60 and rotates the platform 52 and thus carrier 10 clockwise 180° until the platform stop element engages the third baseplate stop element 66, at which point rotation of the platform 52 stops and the carrier 10 is in a second position as shown in FIG. 6B. In the second position, the carrier 10 is positioned such that the first end 15 faces the back wall 38 and the second end 17 faces the front edge 36, thereby enabling attachment of the second handle 40 (FIG. 3) to the second end 17. The operator is then able to insert the carrier 10 into either the first 30 or second 31 aperture of the wet station 32 to clean and etch each wafer 20. Upon completion, the carrier 10 is again placed within the guides 56 and rotated counterclockwise 180° until the platform stop 62 engages the second baseplate stop element 64, at which point rotation of the platform 52 stops and the carrier 10 is returned to the first position.

It is noted that many alternatives of the present invention are possible. Such alternatives include providing a motorized drive assembly adapted to rotate the platform. In addition, a locking mechanism may be provided to secure the platform in either of the first and second positions.

Thus it is apparent that the present invention satisfies the objectives, aim and advantages set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A turntable for rotating a wafer carrier, comprising:

a baseplate having first and second upwardly extending baseplate stop elements;

a platform for supporting said wafer carrier, said platform having a handle and a downwardly extending platform stop element which is adapted to engage either of said first and second upwardly extending baseplate stop elements; and rotating means for enabling rotation of said platform relative to said baseplate when said handle is manipulated wherein said first upwardly extending baseplate stop is positioned to engage said downwardly extending platform stop element to stop said rotation of said platform in a first position and said second upwardly extending baseplate stop element is positioned to engage said downwardly extending platform stop element to stop rotation of said platform in a second position.

2. The turntable according to claim 1, wherein said platform is rotated approximately 180° between said first and second positions.

3. The turntable according to claim 1, wherein said platform includes guides spaced apart for accommodating said wafer carrier.

4. The turntable according to claim 1, wherein said platform and said baseplate are fabricated from stainless steel.

5. The turntable according to claim 1, wherein said platform and said baseplate are fabricated from polyvinyl chloride.

6. A turntable for rotating a wafer carrier, comprising:

a baseplate having first and second upwardly extending baseplate stop elements and a bearing element;

a platform for supporting said wafer carrier, said platform having a handle and a downwardly extending platform stop element which abuts either of said first and second upwardly extending baseplate stop elements;

a rotation element extending from said platform, said rotation element having an end adapted to rotate on said bearing element;

a passageway extending through said platform, said rotation element, said bearing element and said baseplate;

a fastener extending through said passageway, said fastener having a fastener end extending out of said baseplate;

locking means threadably engaged to said fastener end for enabling rotation of said platform and rotation element relative to said bearing element and said baseplate wherein said first upwardly extending baseplate stop element is positioned to engage said downwardly extending platform stop element to stop said rotation of said platform in a first position and said second upwardly extending baseplate stop element is positioned to engage said downwardly extending platform stop element to stop rotation of said platform in a second position.

7. The turntable according to claim 6, wherein said platform is rotated approximately 180° between said first and second positions.

8. The turntable according to claim 6, wherein said platform includes guides spaced apart for accommodating said wafer carrier.

9. The turntable according to claim 6, wherein said platform and said baseplate are fabricated from stainless steel.

10. The turntable according to claim 6, wherein said platform and said baseplate are fabricated from polyvinyl chloride.

11. The turntable according to claim 6, wherein said bearing element and said rotation element are fabricated from polytetrafluoroethylene.

* * * * *